United States Patent [19]

Shinohara et al.

[11] Patent Number: 5,177,706
[45] Date of Patent: Jan. 5, 1993

[54] SEMICONDUCTOR MEMORY DEVICE HAVING A PLURALITY OF PORTS

[75] Inventors: Hirofumi Shinohara; Noriaki Matsumoto; Kumiko Fujimori, all of Hyogo, Japan

[73] Assignee: Mitsubishi Denki Kabushiki Kaisha, Tokyo, Japan

[21] Appl. No.: 666,518

[22] Filed: Mar. 11, 1991

[30] Foreign Application Priority Data

Mar. 13, 1990 [JP] Japan .................................. 2-63670

[51] Int. Cl.⁵ .............................................. G11C 13/00
[52] U.S. Cl. .............................. 365/189.04; 365/230.05
[58] Field of Search ............... 365/185, 189.04, 230.05

[56] References Cited

U.S. PATENT DOCUMENTS 5,088,062 6/1992 Shikata ........................... 365/189.04

FOREIGN PATENT DOCUMENTS

3906895A1 2/1990 Fed. Rep. of Germany .

*Primary Examiner*—Terrell W. Fears
*Attorney, Agent, or Firm*—Lowe, Price, LeBlanc & Becker

[57] ABSTRACT

A semiconductor memory device includes a plurality of ports enabling simultaneous writing and reading of data of M words×N bits. A plurality of memory cells are arranged in (M/n) rows×(n×N) columns in a memory call array, write and read word lines are commonly connected to the memory cells of one row, and write column selecting line are connected to every n (the number of words) memory cells of the memory cells of one row. Write and read bit lines are connected to the memory cells of one column. Data is input to the write bit line from an input terminal through a write circuit. and data read from the memory cell is output to an output terminal through a sense amplifier. A first port is formed by the write word lines, the write column selecting lines, the write bit lines and the input terminal, and a second port is formed by the read word lines, read bit lines and the output terminal. M, N and n are natural numbers and M, N ≧ n.

16 Claims, 18 Drawing Sheets

FIG.2
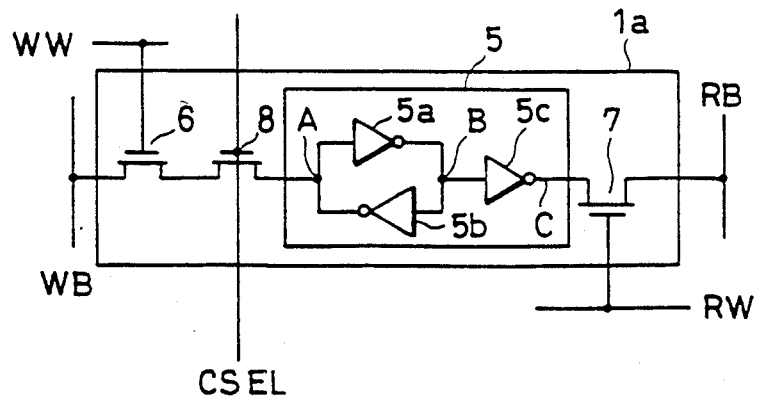
FIG. 3(a)          FIG. 3(b)
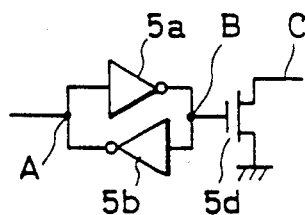   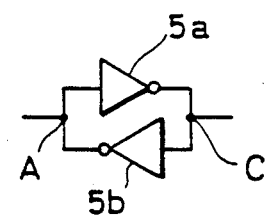
FIG. 3(c)     FIG. 3(d)     FIG. 3(e)
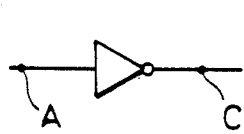   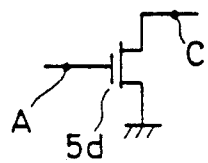   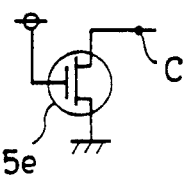
FIG.4              FIG.5
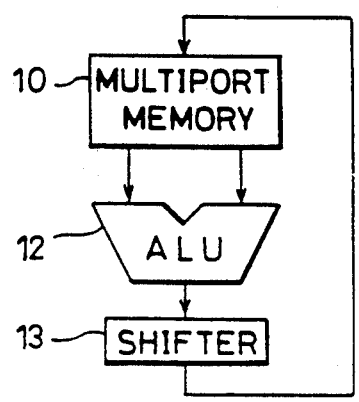   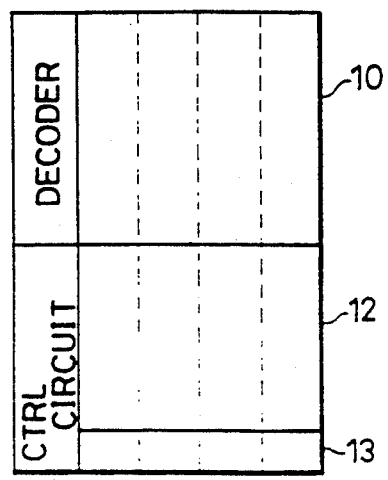

SEMICONDUCTOR MEMORY DEVICE HAVING A PLURALITY OF PORTS

BACKGROUND OF THE INVENTION

1. Field of the Invention

The present invention relates to a multiport memory in which a write port and a read port can independently access to memory cells and, more specifically, to a multiport memory in which 1 bit can correspond to a plurality of columns of a memory cell array.

2. Description of the Background Art

As the semiconductor technique has been developed recently, dual port memories having two inlets of data have been developed in the field of memories. In a dual port memory, master and slave CPUs share one memory to access the same. The master CPU has priority, and the slave CPU accesses the memory when the master CPU is not accessing the memory.

As a further improvement of the dual port memory, multiport memories have been developed in which two or more CPUs can independently access to a common memory. Generally, the dual port memories are also called as multiport memories.

FIG. 25 is a block diagram of a multiport memory having one write port and one read port.

Referring to the figure, the multiport memory has a M words×N bits structure, wherein either M or N is determined as a power of 2. A memory cell 1 stores 1 bit of data. A memory cell array is formed by arranging the memory cells 1 in M rows×N columns. A write address decoder 2a drives write word lines WW0, WW1, . . . WWM - 1 to "1" or "0" in response to an externally applied write address WA. The write word lines are arranged in the row direction in the memory cell array.

A read address decoder 2b drives read word lines RW0, RW1, . . . RWM - 1 to "1" or "0" in response to an externally applied address RA. The read word lines RW0, RW1, . . . RWM - 1 are arranged in the row direction in the memory cell array, and the write word lines WW0, WW1, . . . WWM - 1 and the read word lines are arranged alternately.

A data input circuit 3 drives write bit lines WB0, WB1, . . . WBN - 1 to "1" or "0" in response to externally input data DI0, DI1, . . . DIN - 1. The write bit lines WB0, WB1, . . . WBN - 1 are arranged in the column direction in the memory cell array.

Sense amplifiers 4 are connected to the read bit lines RB0, RB1, . . . RBN - 1 for detecting and amplifying data stored in the memory cells 1 to externally output N bits of data DO0, DO1, . . . DON - 1.

In the following, the write word lines WW0, WW1, . . . WWN - 1, the read word lines RW0, RW1, . . . RWN - 1, the write bit lines WB0, WB1, . . . WBN - 1 and the read bit lines RB0, RB1, . . . RBN - 1 are referred to as WWi, RWi, WBj and RWj (where i=1, 2, . . . N - 1, j=1, 2, . . . N - 1). A write port comprises a write address WA, write word lines WWi, write bit lines WBj, input data DI, a data input circuit 3 and a write address decoder 2a. A read port comprises a read address RA, read word lines RWi, read bit lines RBj, output data DO, a read address decoder 2b and sense amplifiers 4.

FIG. 26 is a detailed circuit diagram of the memory cell 1. The reference characters WW, RW, WB and RB represent arbitrary write word line, read word line, write bit line and read bit line, respectively.

Referring to the figure, the memory cell 1 comprises a write access gate 6, a memory circuit 5 and a read access gate 7. The write access gate 6 has its gate electrode connected to a write word line WW, its drain electrode connected to a write bit line WB and its source electrode connected to the memory circuit 5. The memory circuit 5 comprises a flipflop circuit, an inverter 5c, a write terminal A and an output terminal B, and the flipflop circuit includes inverters 5a and 5b whose output terminals and input terminals are connected to each other. The write terminal A is connected to the source electrode of the access gate 6, and the output terminal B is connected to the inverter 5c. An output terminal (read terminal C) of the inverter 5c is connected to a drain electrode of a read access gate 7. The read access gate 7 has its source electrode connected to the read bit line RB and its gate electrode connected to the read word line RW.

FIG. 27 shows a 2-input 4-output decoder included in each of the address decoders 2a and 2b. Referring to the figure, when 1 bit address is applied through the address lines RA0 and RA1, respectively, the decoder drives one of the write word lines WW0, WW1, WW2 and WW3 to "1" and others to "0". This address decoder is used singly in a multiport memory of 4 words×4 bits as shown in FIG. 30.

FIG. 28 show the data input circuit. Referring to the figure, externally input data DI is set to a prescribed voltage by two stages of inverters to be fed to the write bit line WB.

FIG. 29 (a) shows the sense amplifier 4. The sense amplifier 4 rises the voltage of the data applied from the memory cell 1 through the read bit line RB to a prescribed value by a pull up gate 4a, amplifies the same by inverters 4b and 4c and outputs data DO externally. Other than the circuit shown in FIG. 29 (a), a current detecting type circuit such as shown in FIG. 29 (b) may be used as the sense amplifier.

The operation of the above described conventional multiport memory will be described.

[I] Data writing operation

A word to be written out of M words is designated by an address WA. The write address decoder 2a decodes the designated address WA, sets one of the write word lines WWi to "1" and sets other word lines to "0". The access gate 6 of the memory cell connected to the word line WWi which is set at "1" is rendered conductive, so that the write bit line WBj is electrically connected to the write terminal A. The data DIj to be written is externally applied to the data input circuit 3, and the data input circuit 3 drives the write bit line WBj to "1" or "0" in response to the value of the data DIj. Consequently, if the write access gate 6 is rendered conductive, the value of the write terminal A attains to a value corresponding to DIj, that is, the value driven by the data input circuit 3, regardless of the values of the write terminal A and of the output terminal B of the memory circuit 5.

By the above described operation, writing to the memory cell 1 connected to the write word line WWi is completed. After completion of writing, when the write word line WW1 is set to "0", the write bit line WBj is electrically cut from the write terminal A, and the value written in the flipflop circuit is maintained. Therefore, as long as the write word line WWi is "0", new data cannot be written even if data is input to the write bit line WBj.

[II] Data reading

Reading of data is carried out by the read port. The word to be read out of M words is designated by an external read address RA, the read address decoder 2b decodes the read address RA to set the corresponding one of the read word lines RWi to "1" and set other read word lines to "0". The read access gate 7 of the memory cell 1 connected to the read word line RWi set at "1" is rendered conductive, so that the read terminal C of the memory circuit 5 is electrically connected with the read bit line RBj. Therefore, the value of the read bit line RBj is driven to the value of the read terminal C of the memory circuit 5. Thus the data stored in the memory cell 1 connected to the read word line RWi set at "1" is applied to the sense amplifier 4. The sense amplifier 4 detects and amplifies the applied data, and externally outputs N bits of data DO0, DO1, ... DON - 1.

In the above described conventional multiport memory, when the write word line WWi is set to "1", the data applied from the data input 3 are written to all the memory cells connected to the write word line which is set to "1". Namely, data is written to the memory cells of all columns corresponding to one row of the memory cell array. Therefore one row must correspond to one word, and one column must correspond to one bit, and accordingly an independent bit line must be arranged column by column. Therefore, the ratio of length (M)×width (N) of the memory cell cannot be changed.

Namely, the ratio of length × width is unchangeable, so that the degree of free design is limited when it is connected to other circuits or when it is integrated in combination with other circuits.

SUMMARY OF THE INVENTION

Therefore, an object of the present invention is to provide a semiconductor memory device in which one row of a memory cell array corresponds to n words, and n columns correspond to 1 bit.

Another object of the present invention is to provide a semiconductor memory device having multiports including a write port and a read port, in which one row of a memory cell array corresponds to n words and n columns correspond to 1 bit.

A further object of the present invention is to provide a data path which can be formed relatively easily by using a semiconductor memory device having multiports.

Briefly stated, in accordance with a first aspect of the present invention, a plurality of memory cells each including a data storage node are arranged in rows and columns to form a memory cell array, a write word line and a read word line are commonly connected to memory cells of one row included in the memory cell array, a write column selecting line, a write bit line and a read bit line are connected to memory cells of one column included in the memory cell array. Data for driving the write bit line is input from an input terminal, and data read from the memory cell is output from an output terminal. Electrical connection between the write bit line and the data storage node of the memory cell connected to the write bit line is controlled in response to a signal output to the write word line and the write column selecting line, so that a first port is formed by the write bit lines, write word lines, write column selecting lines and an input terminals. The read word line is driven such that the read bit line is driven to data corresponding to the value of the data storage node of the memory cell, and that data corresponding to a signal on the write bit line is output to the output terminal, so that a second port is formed by the read bit lines, read word lines and an output terminals. At least two sets of write column selecting lines are provided corresponding to each row of memory cells included in the memory cell array, and the write column selecting lines are connected to one memory cell and the other memory cell of the respective adjacent to memory cells of the same row.

Consequently, in accordance with the present invention, the ratio of length and width of the memory cell array layout can be set freely and the number of rows can be decreased. In addition, the number of columns for one bit can be increased and the peripheral circuits such as write circuits or sense amplifiers can be arranged easily. Furthermore, the write bit lines and read bit lines can be shortened, making it possible to reduce delay time required for charge and discharge of those bit lines, and to reduce consumption of power.

In accordance with a second aspect, the present invention provides a data bus comprising first and second ports and using a semiconductor memory device of 1 bit n words, in which n words of memory cells each including a data storage node are arranged in rows and columns to form a memory cell array. A write word line and a read word line are commonly connected to memory cells of one row included in the memory cell array, n write column selecting lines are provided corresponding to the number n of words, each of n write column selecting lines being connected every n memory cells of each row. A write bit line and a read bit line are connected to memory cells of the same column included in the memory cell array. The input data are written to any of the plurality of memory cells by writing means, and the writing means together with the write word lines, write column selecting lines and the write bit lines constitute a first port. Data read from any of the plurality of memory cells is amplified by amplifying means, the amplifying means, read word lines and read bit lines constitute a second port, and the data output from the amplifying means is applied to an arithmetic logic operation means of 1 bit structure to be subjected to arithmetic operation.

Therefore, in accordance with the second aspect of the invention, layout of data bus can be easily carried out by using a semiconductor memory device having multiple ports, and in addition, the area thereof can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 shows details of the memory cell shown in FIG. 1;

FIG. 3 comprising FIGS. 3A-3E shows a modification of a memory circuit;

FIGS. 4 and 5 show integration of the multiport memory of FIG. 1 in combination with other circuits;

DESCRIPTION OF THE PREFERRED EMBODIMENTS

Figure 1:
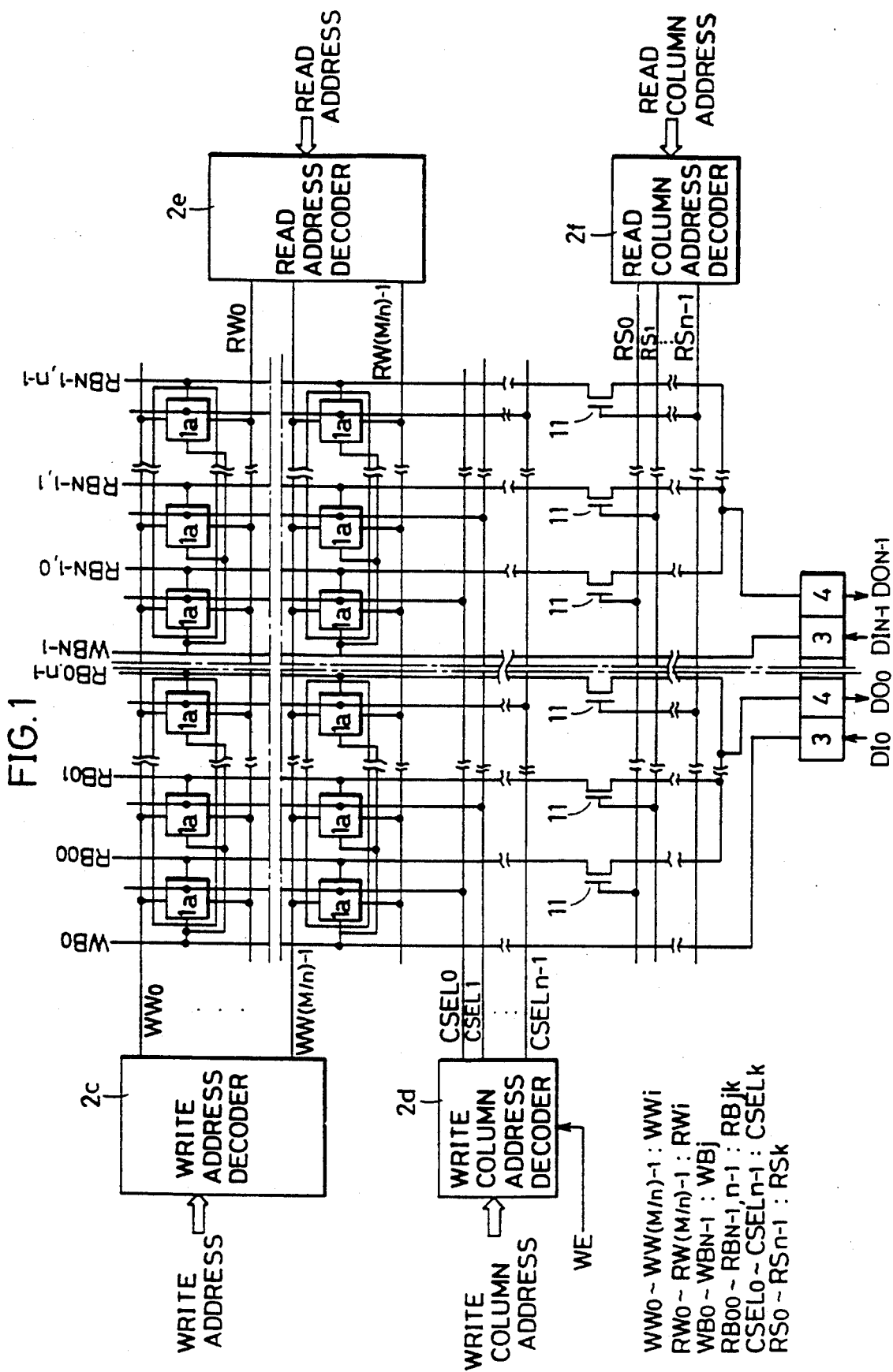
FIG. 1 is a block diagram showing one embodiment of the present invention.

FIG. 1 is a block diagram showing one embodiment of the present invention. Referring to the figure, the multiport memory is a M word N bit memory as is the multiport memory of FIG. 25, including a data input circuit 3 and sense amplifiers 4. Different from in that of FIG. 25, the multiport memory comprises a memory cell array including memory cells 1a arranged in rows and columns, a write address decoder 2c, a write column address decoder 2d, a read address decoder 2e, a read column address decoder 2f and a read column selecting gate 11. In the memory cell array, memory cells 1a are arranged in M/n rows and n×M columns, where M, N and M/n are natural numbers.

Figure 25:
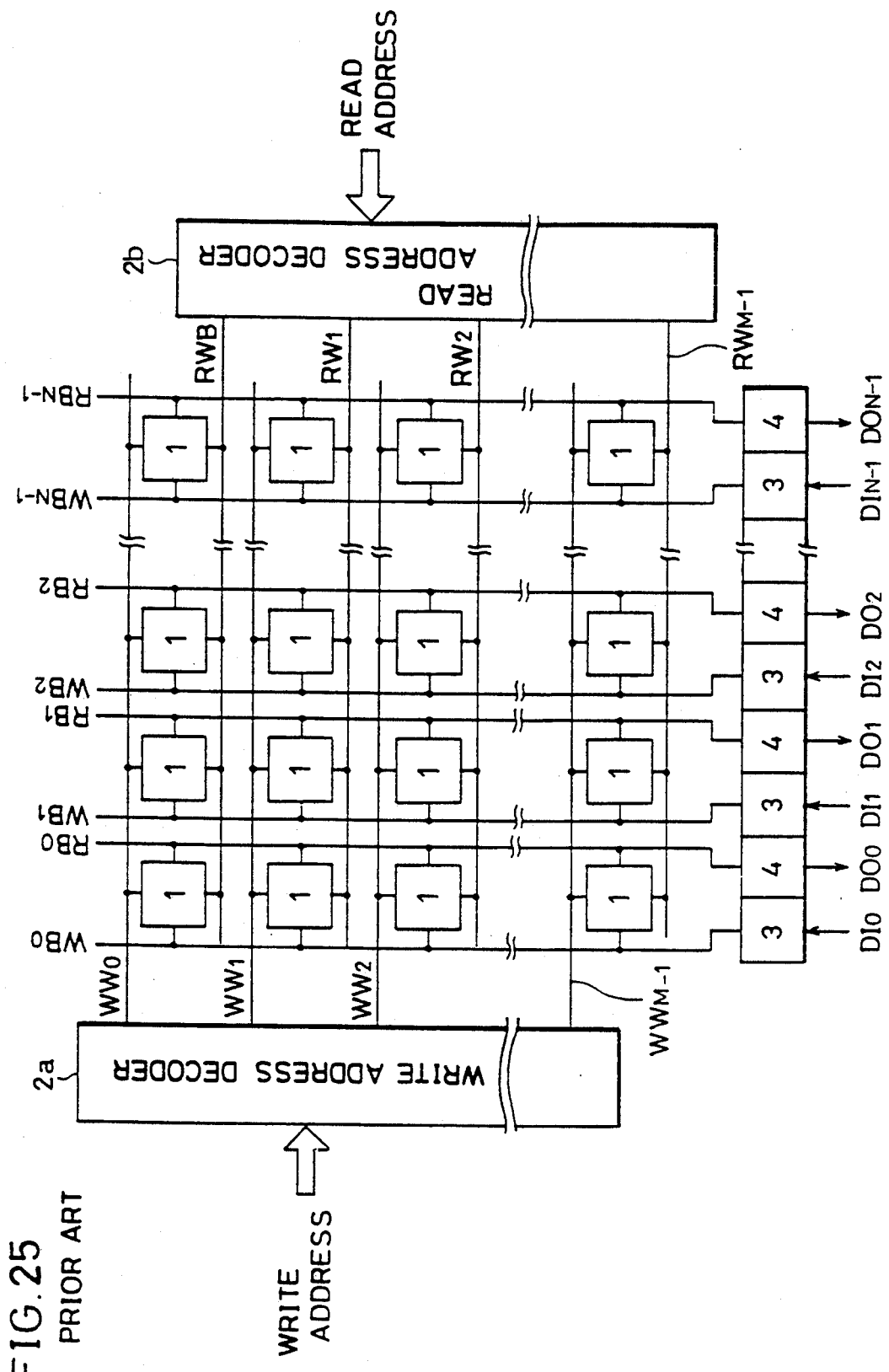
FIG. 25 is a block diagram of a conventional multiport memory.

In the row direction of the memory cell array, M/n write word lines WWi (different from FIG. 25, i=0, 1, ... (M/n) - 1) are arranged, and read word lines RWi are arranged alternately with the write word lines WWi, e.g. the write word lines and read word lines may be arranged in the order of WW0, RW0, WW1, RW1 ... or they may be arranged as WW0, RW0, RW1, WW1, WW2, RW2, RW3 In the column direction of the memory cell array, N write bit lines WBj (where j=0, 1, ... N - 1) and n×N read bit lines RBjk (where k=0, 1, ... n - 1) are arranged. Further, in the row direction of the memory cell array, n column selecting lines CSELk for controlling a column selecting gate 8 in the memory cell 1a, which will be described later, are arranged. The column selecting lines CSELk are branched in the column direction, and each of the branched column selecting lines is connected to the memory cells 1a of the same column.

The write address decoder 2c selects a desired word line out of M/n write word lines WWi in response to an external write address and drives the same to "1" or "0". The write column address decoder 2d drives a desired column selecting line out of n column selecting lines CSELk to "1" or "0" in response to an external write column address.

The read address decoder 2e selects a desired word line out of M/n read word lines RWi in response to an external read address and drives the same to "1" or "0". The read column address decoder 2f drives a desired column selecting line out of n column selecting lines RSk in response to an external column address to drive the same to "1" or "0".

Each of the read column selecting gates 11 comprises an N channel transistor, and the transistor has its gate electrode connected to a read column selecting line RSk, its drain electrode connected to a read bit line RB and its source electrode connected to the sense amplifier 4. The read column selecting gates are divided into groups each including n gates, whose source electrodes are commonly connected in each group. The write bit line WBj is connected to a data input circuit 3 and applies the same data to n memory cells 1a connected to the write bit line WBj.

As described above, the write port of the multiport memory comprises a write port WA, write word lines WWi, write word lines WBj, input data DI, a write address decoder 2c, a write column address decoder 2d, write column selecting lines CSELk and a data input circuit 3. The read port comprises a read address RA, read word lines RWi, read bit lines RBjk, read column selecting lines RSk, data output DO, a read address decoder 2e, a read column address decoder 2f and sense amplifiers 4.

Figure 26:
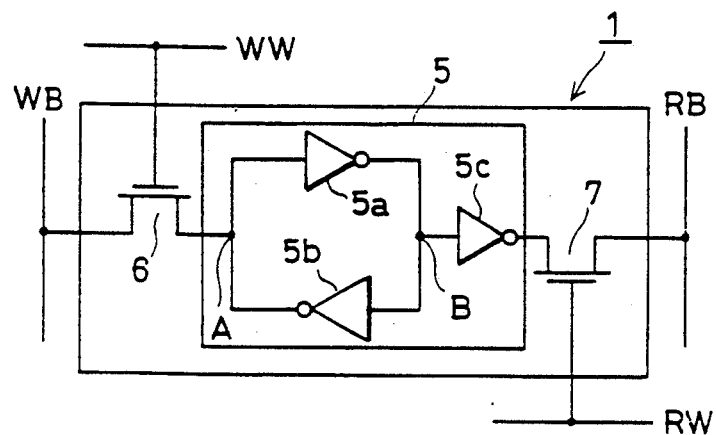
FIG. 26 is a circuit diagram of a memory cell of FIG. 25.
Figure 27:
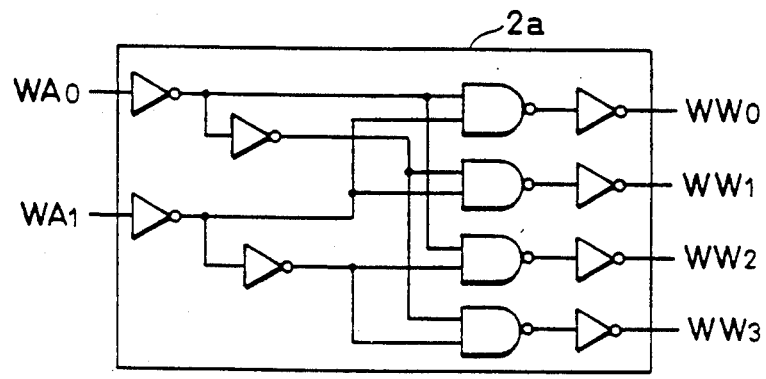
FIG. 27 is a circuit diagram of a data input circuit of FIG. 25.
Figure 28:
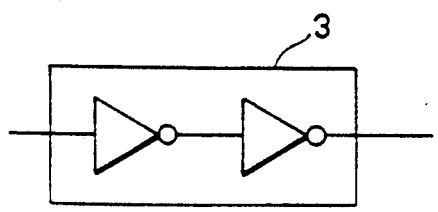
FIG. 28 is a circuit diagram of a 2-input 4-output address decoder.
Figure 29A:
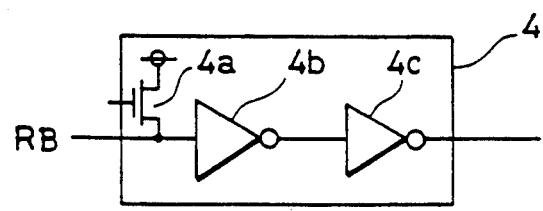
FIGS. 29 (a) and 29 (b) are circuit diagrams of a sense amplifier.
Figure 29B:
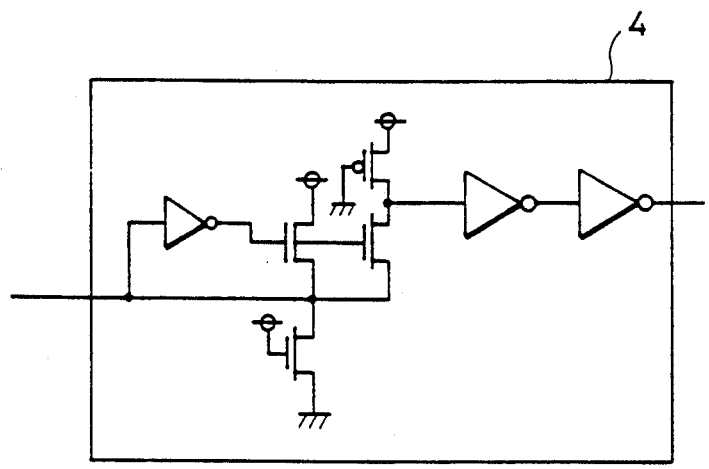
Figure 30:
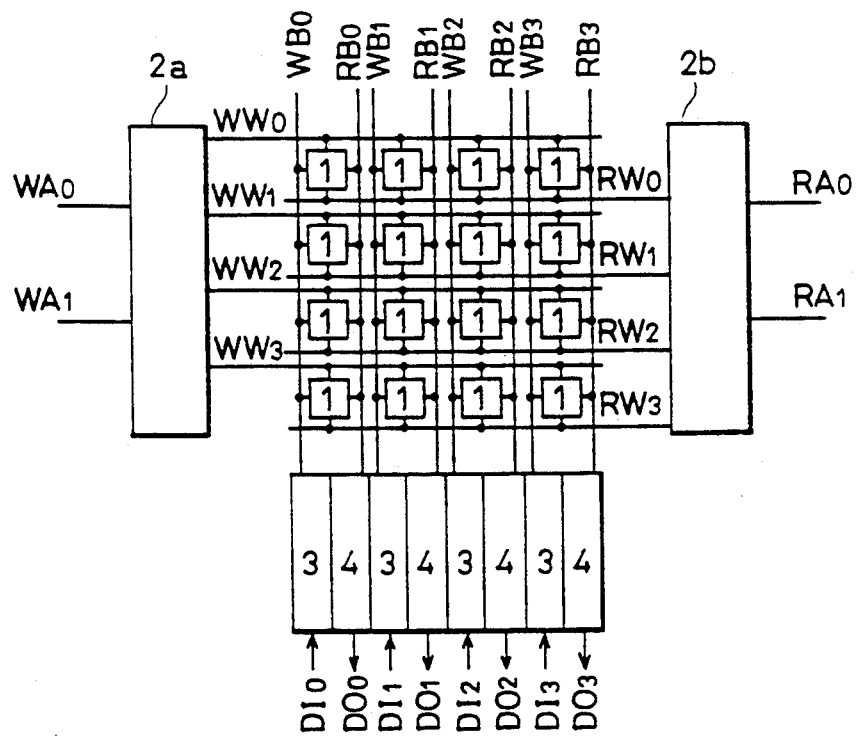
FIG. 30 is a block diagram of a conventional 4 words×4 bits multiport memory.

FIG. 2 shows details of the memory cell 1a of FIG. 1. The memory cell 1a is different from that of FIG. 26 in that a write column selecting gate 8 is provided between the access gate 6 and a write terminal A whose gate electrode is connected to the column selecting line CSEL, so that when signals from the write word line WW and the column selecting line CSEL are input to the gate 8, the line WB and the terminal A are electrically connected. Portions corresponding to those in FIG. 26 are denoted by the same reference characters and description thereof is not repeated.

The memory circuit 5 comprises three inverters 5a, 5b and 5c. However, circuits shown in FIGS. 3 (a) to 3 (e) may be used. FIGS. 3 (a) and 3 (b) represent static RAMs. FIGS. 3 (c) and 3 (d) are dynamic RAMs in which data are stored dependent on the amount of charges stored in the write terminal A. FIG. 3 (e) represents a ROM in which conduction/non-conduction of an N channel MOSFET 5e is programmed in advance.

The operation of the multiport memory shown in FIGS. 1 and 2 will be described in the following.

[I] Write operation

An address to be written is externally applied to the write address decoder 2c, and N bits of data DI0, DI1, ... DIN - 1 to be written are applied to the data input circuit 3. The write address decoder 2c decodes the external address, drives the write word line WWi corresponding to the aimed row to "1" and drives other write word lines to "0".

The write column address is decoded by the write column address decoder 2d, which drives the desired column selecting line out of n column selecting lines CSELk to "1" and drives other column selecting lines to "0". Consequently, the access gates 6 of the memory cells 1a of one row connected to the driven write word line WWi are rendered conductive, and the write column selecting gate 8 connected to the column selecting line SCELk driven to "1" is rendered conductive.

Consequently, the write bit line WBj is electrically connected to the write terminal A of the memory circuit 5, whereby the data DIj applied to the data input circuit 3 is written in the memory circuit 5.

In this case, the sum of output resistance of the data input circuit 3, ON resistance of the access gate 6 and ON resistance of the selecting gate 8 is set to be smaller than output resistance of the inverter 5b, and the value at the write terminal A becomes the same as the value DIj designated in the data input circuit 3, regardless of the initial value of the output terminal B of the flipflop and of the write terminal A.

Writing of data is completed in this manner. In the memory cells 1a connected to the column selecting lines CSELk driven to "0", the write bit lines WBj are electrically separated from the write terminals A, so that writing is not carried out and the data therein is maintained as it is. Therefore, the memory cells 1a of the column which is not selected by the column address maintain the data, even if the memory cells are connected to the row designated by the externally input write address. Further, by controlling the column selecting line CSELk by applying an enable signal WE to the column address decoder 2d, data of all memory cells 1a can be maintained.

[II] Reading operation

A word to be read out of M words is designated by a read address, the read address decoder 2e decodes the read address, drives one of the M/n read word lines RWi to "1" and drives other read word lines to "0". Access gates 7 of the memory cells 1a connected to the read word line RWi driven to "1" are rendered conductive, and the read terminal C is electrically connected to the read bit line RBjk.

Consequently, the read bit line RBjk is driven to the value of the read terminal C. This value is applied to the drain electrode of the read column selecting gate 11. The read column address decoder 2f decodes an externally applied read address, drives one of n read column selecting lines RSk to "1" and drives other read column selecting lines to "0". The read column selecting gates 11 whose gate electrodes are connected to the read column selecting line driven to "1" are rendered conductive, and thus the number k (0, 1 ... n - 1) of the read bit lines RBjk is selected.

In this manner, in the reading operation, the row (j) of the read bit lines RBjk is designated by the read address decoder 2e, and the column (k) is designated by the read column address decoder 2f. Therefore, the data of the memory cell 1a of the designated row and column is applied through the column selecting gate 11 to the sense amplifier 4, detected and amplified by the sense amplifier 4, and thereafter N bits of data DO, DO1, ... DOn - 1 are externally output.

The read column selecting gate 11 can be provided outside of the memory cell 1a, since the write terminal A and the output terminal B of the flipflop circuit are not inverted, even if the read word line RW is set to "1". Although the write address decoder 2c, the write column address decoder 2d, the read address decoder 2e, the read column address decoder 2f are arranged divided on both sides of the memory cell array in the above example, these elements may be arranged on either side of the memory cell array. They may be arranged on the upper side of the memory cell array.

In the above described multiport memory, a write bit line WW can be commonly used by adjacent two memory cells, M words × N bits can be made (M/n row) × (n × N columns), so that connection between the peripheral circuit can be made easier compared with the prior art. In addition, production of integrated circuits formed integral with the peripheral circuits is facilitated. The structure of the integrated circuit will be described with reference to FIGS. 4 and 5.

When a data bus of a processor is to be formed by integrally forming a multiport memory 10, an ALU 12 and a shifter 13, connecting terminals of the ALU 12 and the shifter 13 generally requires 50 to 100 times manufacturing process design (gate length: 1 μm) per 1 bit, while the width of one column in the memory cell array 10 requires 15 to 30 times design rule. Therefore, when the number of columns of the memory cells are made 2 to 4 per 1 bit, the width per 1 bit of the multiport memory coincides with the width per bit of the ALU 12 and the shifter 13. Therefore, there is not unnecessary margin. Consequently, the multiport memory and, the ALU and the shifter can be laid out in tight contact as shown in FIG. 5. In FIG. 5, each of the sections divided by the dotted lines corresponds to the width of 1 bit.

Figure 6:
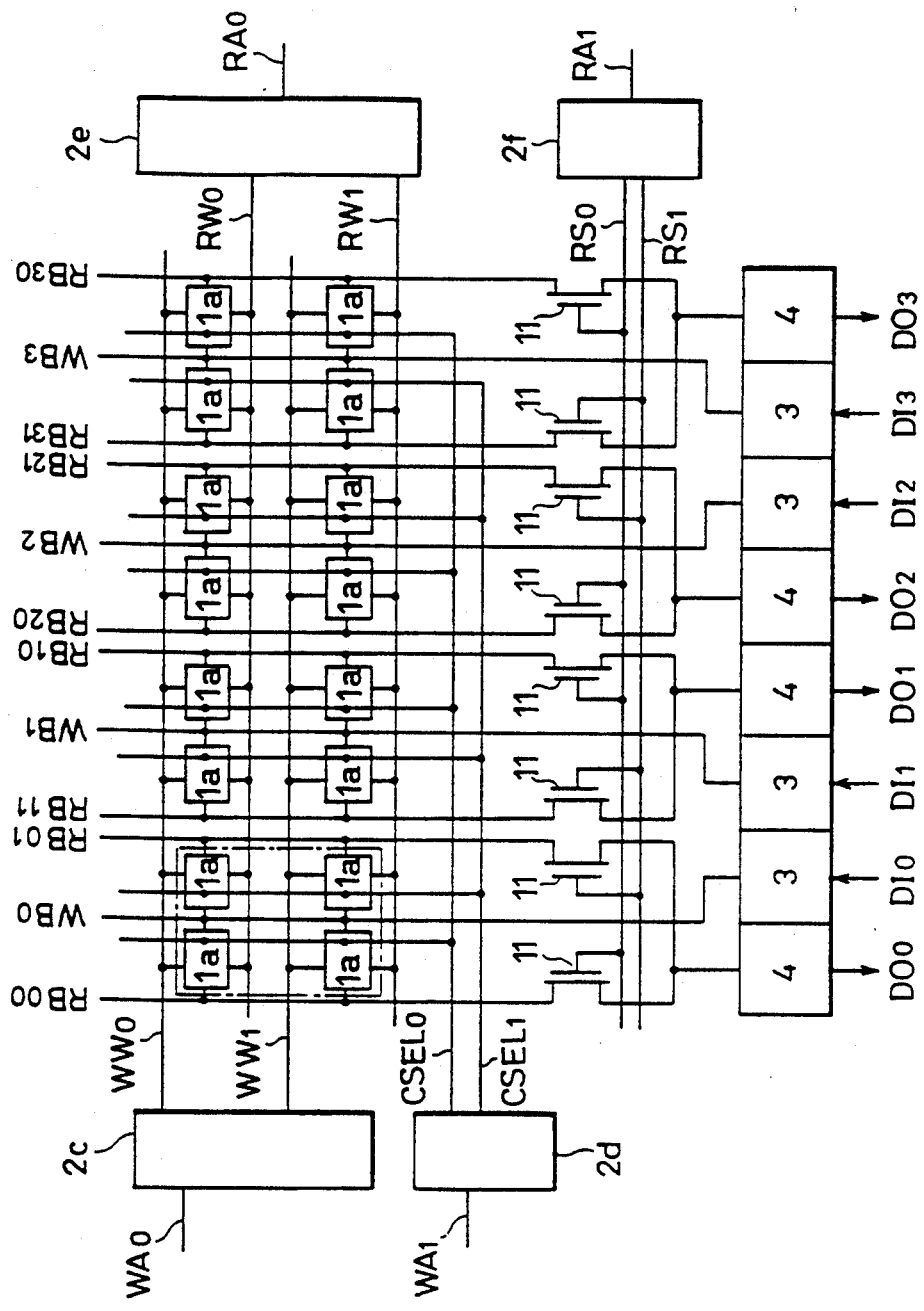
FIG. 6 is a block diagram showing a memory of 4 words × 4 bits formed by 2 rows × 8 columns.

FIG. 6 is a block diagram showing an example in which the multiport memory of FIG. 1 of 4 words × 4 bits formed in 2 rows 8 columns. Referring to the figure, the multiport memory comprises one write port and one read port. One row corresponds to 2 words, and 2 columns correspond to 1 bit. A write address decoder 2c is connected to an address line WA0, decodes an external address and drives either the write word line WW0 or WW1 to "1". A write column address decoder 2d is connected to one address WA1, decodes an external address and drives either a column selecting line CSEL0 or CSEL1 to "1". A read address decoder 2e is connected to one address line RA0, decodes a read address and drives either the read word line RW0 or RW1 to "1". The read address decoder 2f is connected to an address line RA1, decodes an address data, and drives either the read column selecting line RS0 or RS1 to "1". Each of the read column selecting gates 11 has its drain electrode connected to a read bit line RBjk (where j=0, 1, and k=0, 1) and its source electrode connected to the source electrode of the adjacent column selecting gate 11 and to the sense amplifier 4.

By the above described structure, a 4 words × 4 bits multiport memory can be formed to have 2 rows and 8 columns. The write bit line WB are commonly used, and therefore the number thereof can be made the same as that of the prior art, although the memory has 8 columns. Further, since the read bit lines RBjk are selected by the read column selecting gates 11, the number of the sense amplifiers 4 is also the same as that of the prior art.

Figure 7:
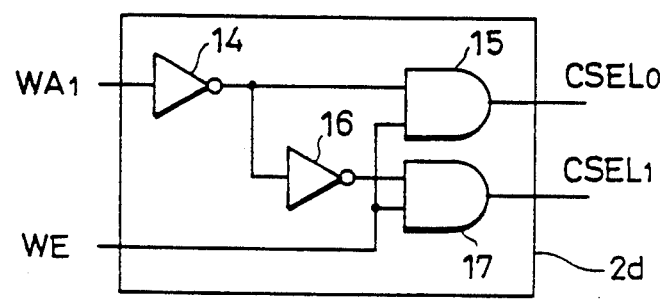
FIG. 7 shows details of a write column address decoder of FIG. 6.

FIG. 7 shows the details of the write column address decoder 2d of FIG. 6.

Referring to the figure, the write column address decoder 2d comprises inverters 14 and 16, and AND gates 15 and 17. The operation will be described assuming that the write column address WA1 is "1". The external write column address WA1 is inverted by the inverter 14 to be applied to the AND gate 15 and the inverter 16. The AND circuit 15 drives the write column selecting line CSEL0 to "0" unless the enable signal WE is set to "0". The inverter 16 inverts the output from the inverter 14 to apply the same to the AND circuit 17. Consequently, the write column selecting line CSEL1 is driven to "1" so long as the enable signal WE is "1". Namely, when the enable signal WE is "1", it operates as a general decoder, and when the enable signal WE is "0", the column selecting lines CSEL0 and CSEL1 are both set to "0", so that data of all memory cells 1a are maintained.

Figure 9A:
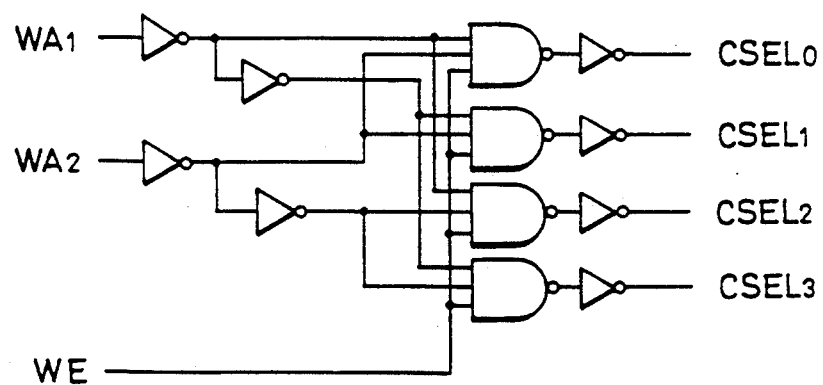
FIGS. 9 (a) and 9 (b) show a 2-input 4-output address decoder.
Figure 9B:
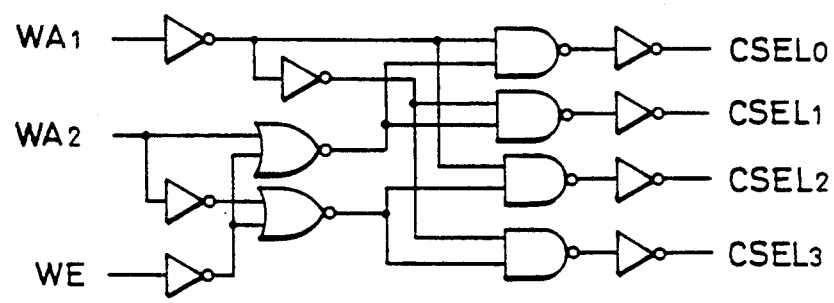

A 1-input 2-output write column address decoder 2d is shown in FIG. 7. A 2-input 4-output decoder may be provided to form a memory cell array of 4 rows. An example of a 2-input 4-output address decoder is shown in FIGS. 9(a) and 9(b).

Figure 8:
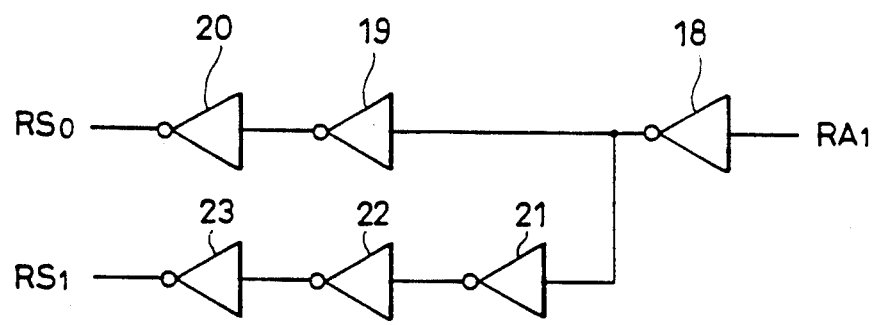
FIG. 8 shows details of a read address decoder.

FIG. 8 shows the details of the read column address decoder. Referring to the figure, an external read column address RA1 is inverted by three stages of inverters 18, 19 and 20 to provide a signal on the read column selecting line RS0. The read column selecting line RS1 is driven to the value of the read column address RA1 by 4 stages of inverters including the above inverter 18 and inverters 21, 22 and 23.

The address decoders 2c and 2e has the same structure as the address decoder of FIG. 8.

Figure 10:
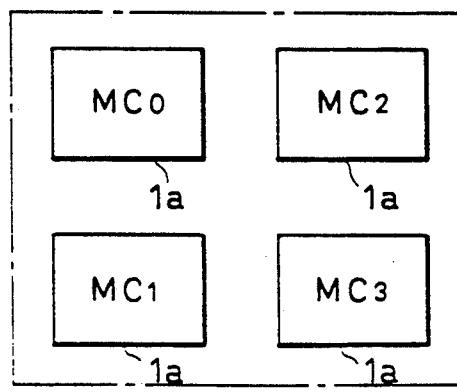
FIG. 10 show a layout of memory cells illustrating the operation of the multiport memory shown in FIG. 7.
Figure 11:
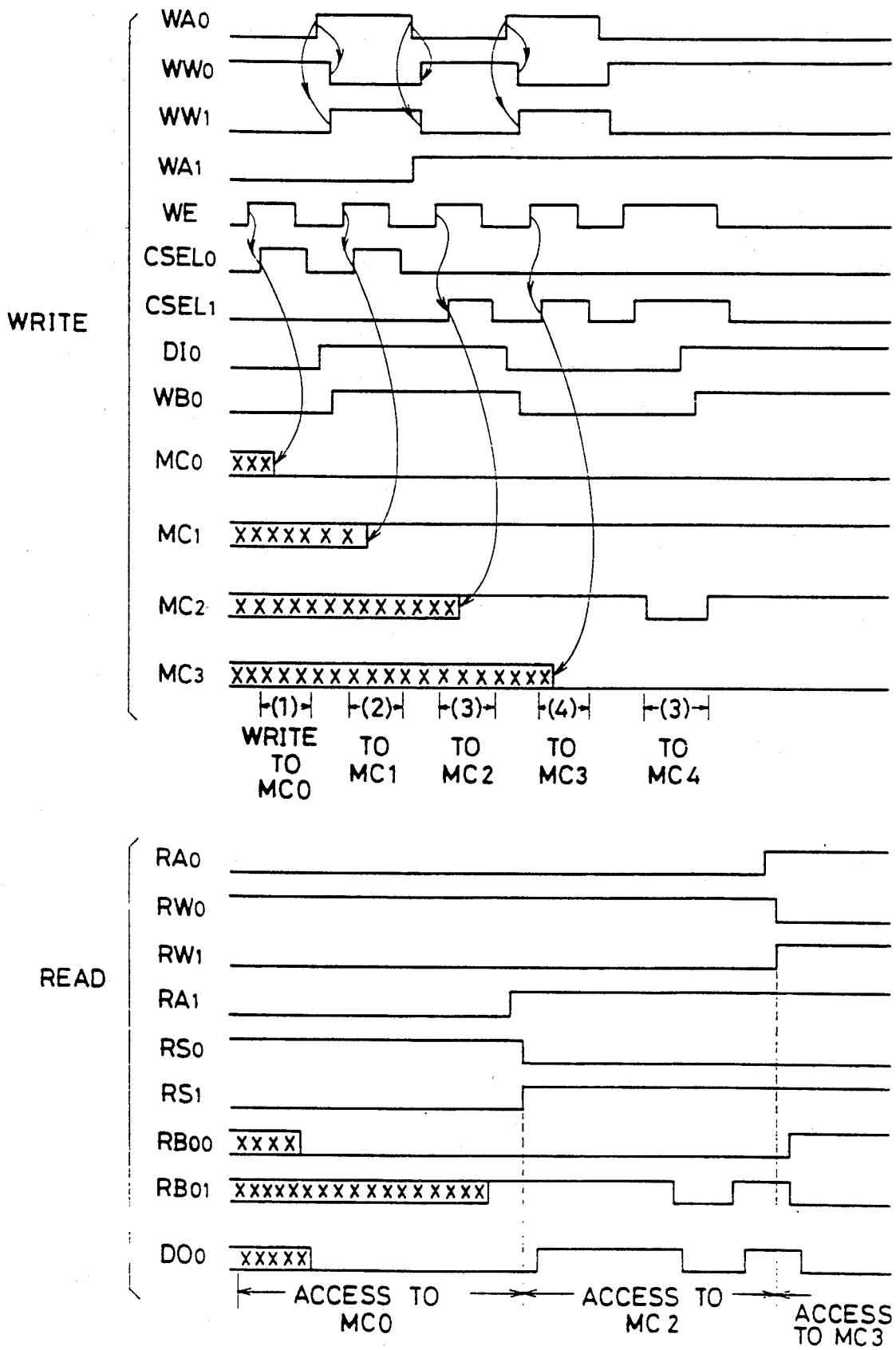
FIG. 11 is a timing chart of FIG. 7.

The operation of the multiport memory shown in FIGS. 6 to 9 will be described with reference to FIGS. 10 and 11. In FIG. 10, the memory cells surrounded by one dotted lines in FIG. 6 are shown as MC0, MC1, MC2 and MC3. FIG. 11 is a timing chart in which marks xxx show that the data in the memory cell 1a is in the state before rewriting.

[I] Writing operation (1) Writing to MC0

When WA0 is at "0", the write address decoder 2c sets the write word line WW0 to "1" and WW1 to "0". Correspondingly, access gates 6 of MC0 and MC2 are rendered conductive. Thereafter, the address WA1 attains to "0" and the enable signal WE attains to "1", and then the write column address decoder 2d sets the column selecting line CSEL0 to "1". Correspondingly, the column selecting line gates 8 of MC0 and MC1 are rendered conductive. Consequently, writing to the memory circuit 5 of the memory cell MC0 of the selected row and column is enabled by the write address WA0 and the write column address WA1.

(2) Writing to MC1

When the write address WA0 is "1", the write address decoder 2c sets the write address line WW0 to "0" and WW1 to "1". Correspondingly, access gates 8 of MC1 and MC3 are rendered conductive. Then, since the write column address WA1 is 0 as in the former case (1), when the enable signal WE attains to "1", the write column address decoder 2d sets the column selecting line CSEL0 to "1". Correspondingly, the column selecting gates 8 of MC0 and MC1 are rendered conductive. Consequently, writing to the memory circuit 5 of the memory cell MC1 of the row and column selected by the write address WA0 and the write column address WA1 is enabled.

(3) Writing to MC2

When writing to the memory cell MC2 is to be done, WA0 is set to "0" and WA1 to "1". When the enable signal WE1 is set to "1" in this state, writing to the memory cell MC2 only is enabled. In this state, since the input data DI is 1, "1" is written to MC2.

(4) Writing to MC3

Writing to MC3 is carried out when the write address WA0 is "1", the write column address WA1 is "1" and the enable signal WE is "1". Since the input data DI0 in this state is "0", "0" is written to MC3.

[II] Reading operation

The reading operation will be described. As in the writing operation, designation of 2 words is carried out by the read address RA0, and selection of read column is carried out by RA1. More specifically, when the data in MC0 is to be read, the read address RA0 is set to "0" and the read column address RA1 is set to "0". Correspondingly, the read column address decoder 2e sets the read word line RW0 to "1" and turns on the read access gates 7 of MC0 and MC2. The read column address decoder 2e sets RS0 to "1" to turn on the read column selecting gate 11 connected to the read bit line RB00. Consequently, the read terminal C of MC0 is connected to the sense amplifier 4. At this time, the data of the memory cell MC0 is applied to the sense amplifier 4.

In the same manner, when data is to be read from MC1, RA0 is set to "1" and the read column address RA1 is set to "0". Further, reading of data from MC2 is carried out by setting the read address RA0 to "0" and the read column address RA1 to "1". Further, reading of data from MC3 is carried out by setting the read column address RA0 to "1" and the read column address RA1 to "1".

Figure 12:
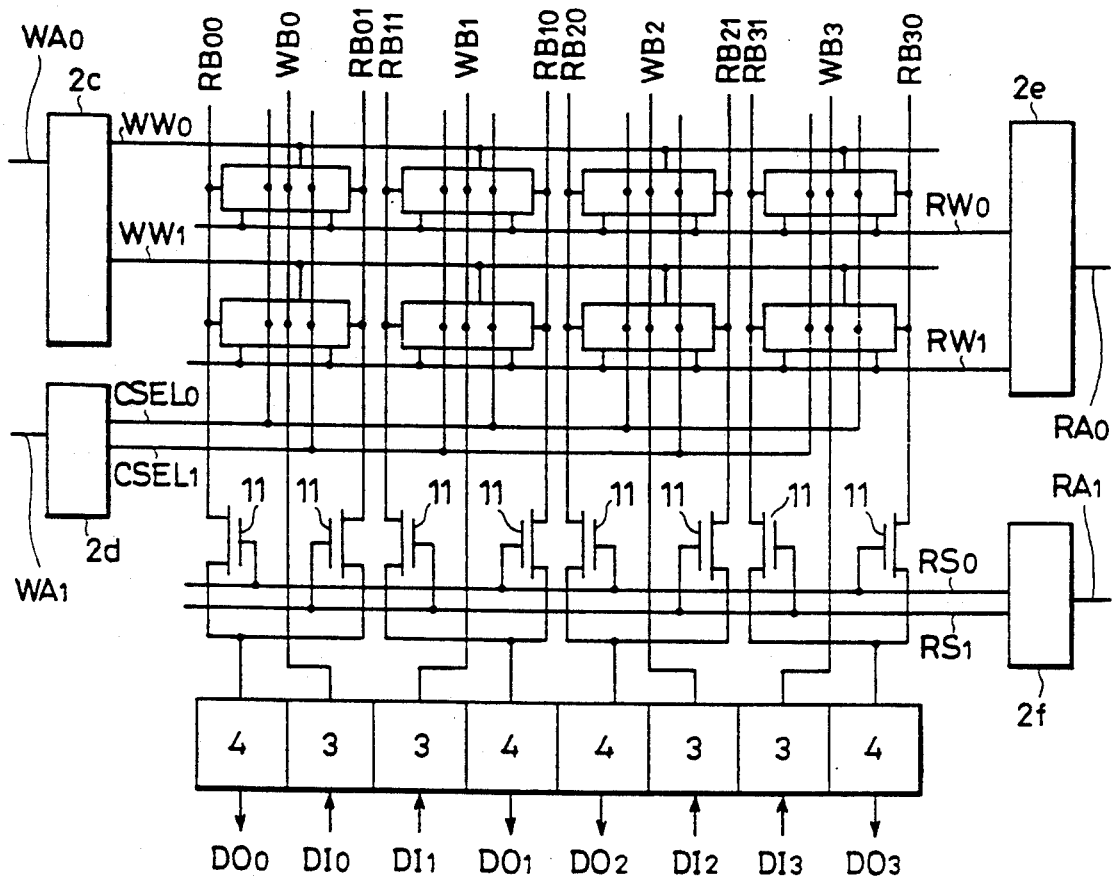
FIG. 12 is a block diagram showing another embodiment.
Figure 13:
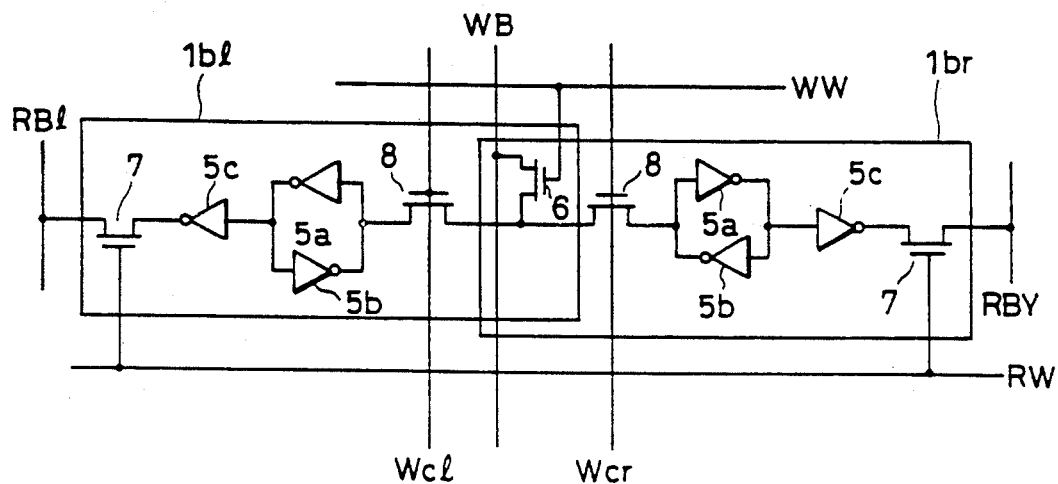
FIG. 13 shows details of the memory cell of FIG. 12.

FIGS. 12 and 13 show one embodiment, in which FIG. 12 is a schematic diagram of the entire multiport memory, and FIG. 13 shows the details of the memory cell of FIG. 12. Referring to FIGS. 12 and 13, this embodiment differs from that of FIGS. 6 and 7 in that two adjacent memory cells 1bl and 1br of the same row share a write access gate 6. By this structure, the number of access gates 6 can be made half, increasing production yield, reliability and speed of operation, derived from reduction in capacity of the write word line WW.

Figure 14:
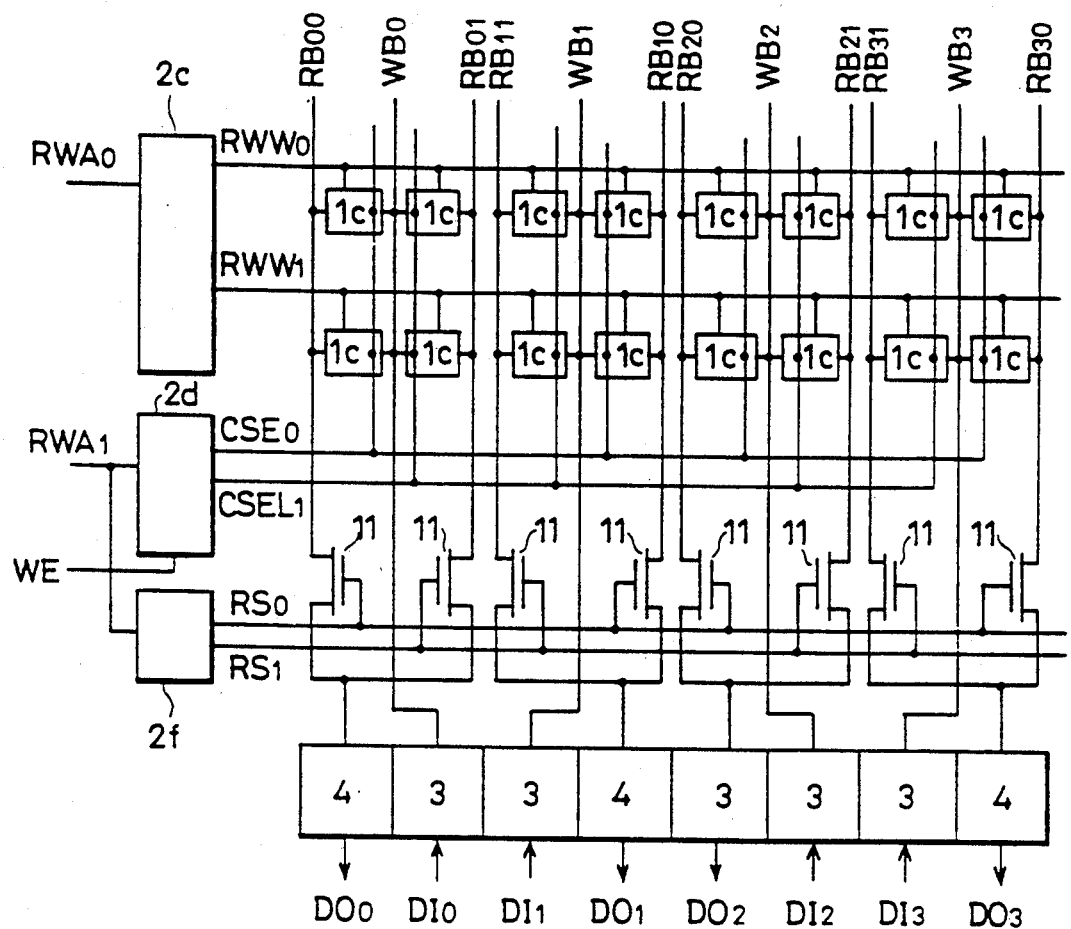
FIG. 14 is a block diagram showing a further embodiment.
Figure 15:
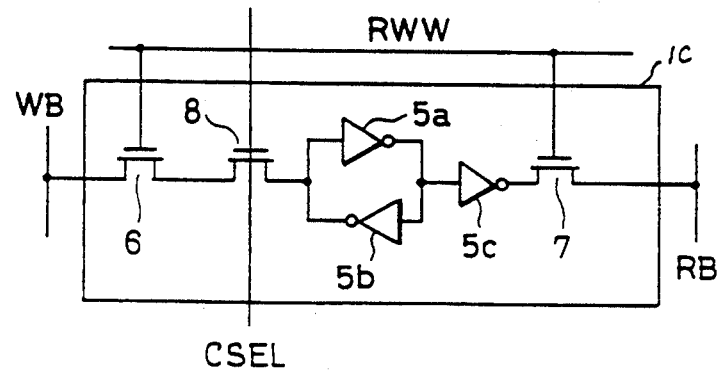
FIG. 15 is a block diagram showing details of the memory cell of FIG. 14.

FIGS. 14 and 15 show another embodiment in which FIG. 14 is a schematic diagram of the entire multiport memory and FIG. 15 shows details of the memory cell array of FIG. 14. Referring to FIGS. 14 and 15, this embodiment differs from that of FIGS. 6 and 2 in that a readable and writable word line RWW is commonly used as the write word line WW and the read word line RW. Therefore, the structure of the multiport memory can be further simplified. This memory cell 1c is applied to a readable and writable port.

In this case, if there is no write selecting gate 8, when the read access gate 7 is rendered conductive, the write access gate 6 is simultaneously rendered conductive in response to the read write word line RWW reaching "1", so that reading and writing occur simultaneously, and therefore it cannot be used practically. However, by providing the column selecting gate 8, the timings of reading and writing can be controlled, and therefore the entire structure of a readable and writable port can be made simple.

Figure 16:
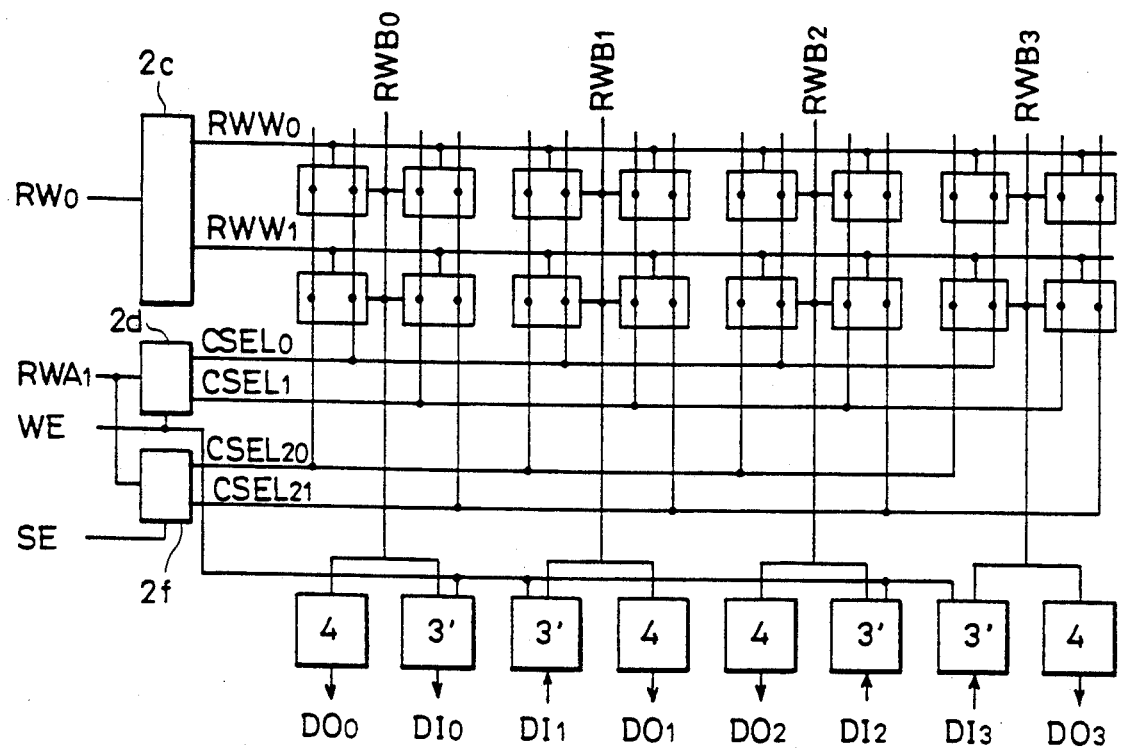
FIGS. 16 and 17 show a further embodiment.
Figure 17:
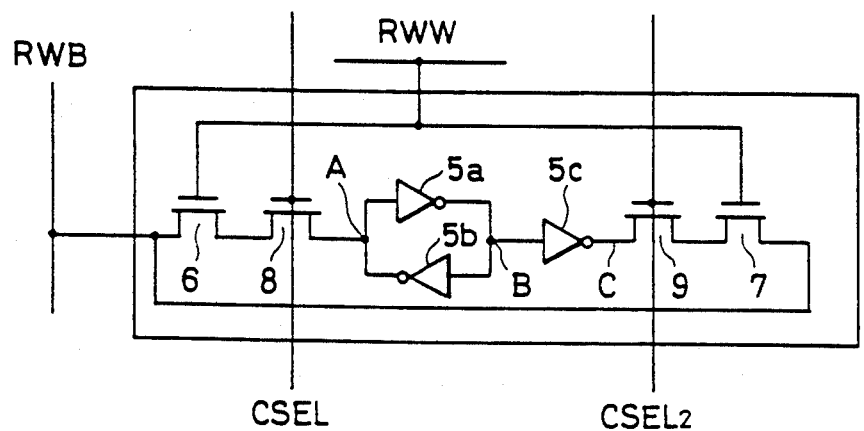
Figure 18:
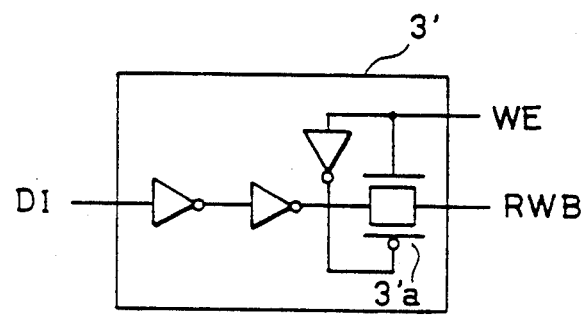
FIG. 18 shows details of a data input circuit of FIG. 16.
Figure 19:
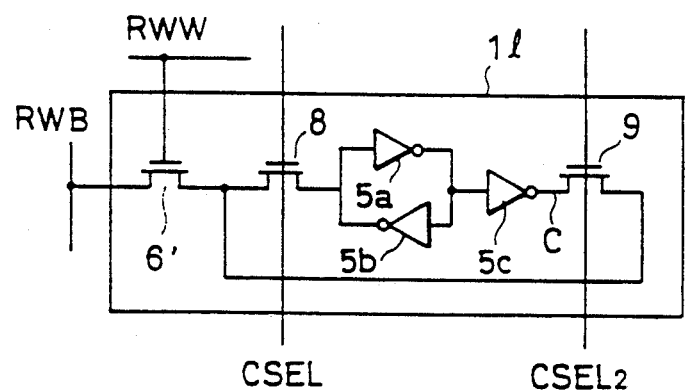
FIG. 19 shows a modification of the memory cell of FIG. 17.

FIGS. 16 and 17 are block diagrams showing a further embodiment. FIG. 16 is a block diagram of the whole multiport memory, and FIG. 17 shows details of the memory cell of FIG. 16. Referring to the figures, this embodiment differs from that of FIG. 14 in that column selecting lines CSEL20 and CSEL21 are additionally provided and that a read write bit line RWB is used commonly as the read bit line RB and the read word line WB. The data input circuit 3' is adapted to control a tristate gate 3a' by the enable signal WE (see FIG. 18). The write access gate 6 and the read access gate 7 of the memory cell 1c of FIG. 17 may be used commonly to provide such a structure as shown in FIG. 19.

A 4-words 4-bits multiport memory having a memory cell array of 2 rows×8 columns, a write port, and a read port has been described with reference to FIGS. 6 to 19. However, the numbers thereof can be generally represented by natural numbers M, N, n, a, b and c. More specifically, as described above, a memory cell array of M words×N bits can be formed of M/n rows and n×N columns, and the number of write ports, the number of read ports and the number of write read ports can be a, b and c, respectively, where $n \geq 2$, M/n is an integer, and c may be c=0. If $c \geq 1$, then a or b may be 0.

Figure 20:
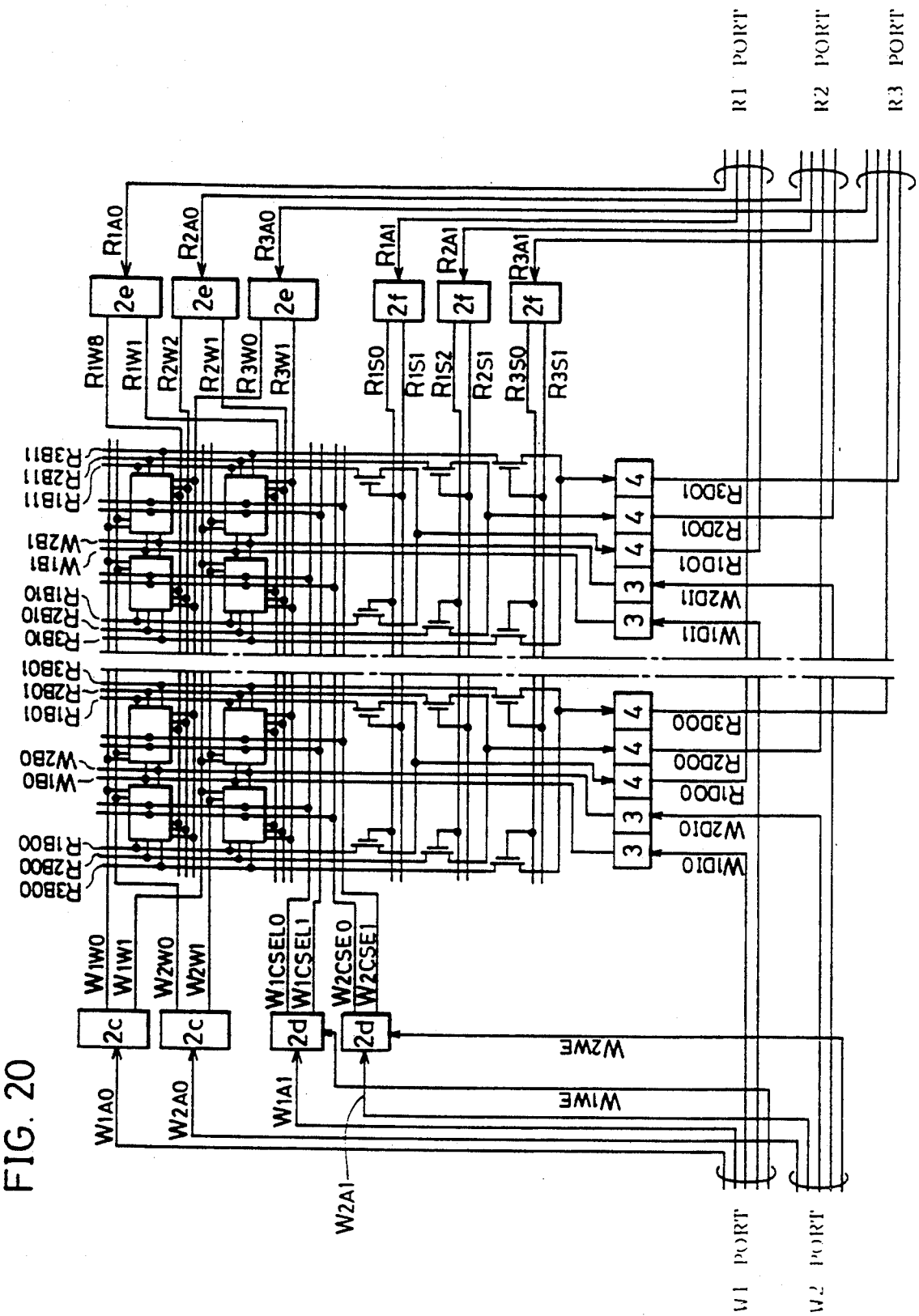
FIG. 20 is a block diagram showing another embodiment of FIG. 7.
Figure 21:
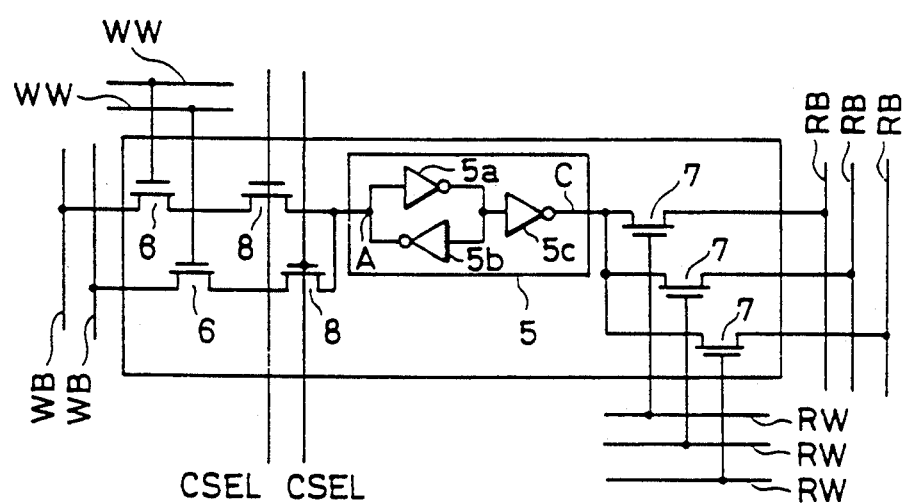
FIG. 21 shows details of the memory cell of FIG. 20.

FIG. 20 is a block diagram showing a further embodiment of FIG. 6, and FIG. 21 shows the details of the memory cell array of FIG. 20.

Referring to the figures, this embodiment differs from that of FIG. 6 in that two write ports W1 and W2 and three read ports R1, R2 and R3 are provided. Therefore, accordingly, two write address decoders 2c are provided which are connected to address lines W1A0 and W2A0 receiving external write addresses, respectively. Two write column address decoders 2d are provided and connected to write column address lines W1A1 and W2A1, respectively. Two data input circuits 3 receiving write data DI from respective ports are arranged bit by bit.

Since there are three read ports, the numbers of the read address decoders 2e, the read column address decoders 2f, the sense amplifiers 4 and the read column selecting gates 11 are tripled.

Figures 22, 23:
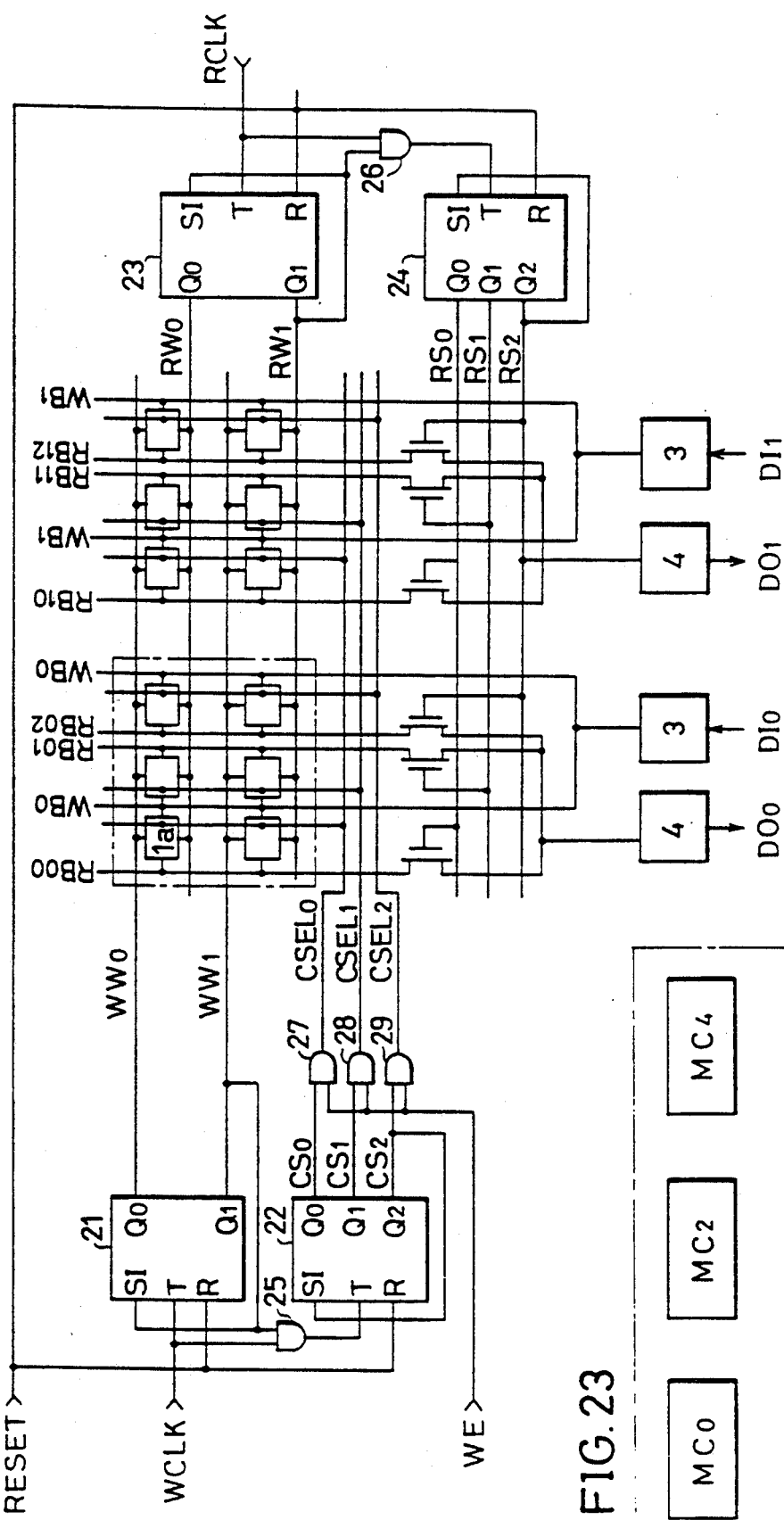
FIG. 22 is a block diagram showing a further embodiment.
FIG. 23 is a layout of memory cells illustrating the operation.

FIG. 22 shows a serial access type multiport memory. Referring to the figure, this multiport memory is different from that of FIGS. 1 to 21 in the following points. Namely, instead of the write address decoder 2c, write column address decoder 2d, the read address decoder 2e and the read column address decoder 2f, shift registers 21 to 24 and AND gates 25 to 29 are used realizing a so-called first in first out system in which values of shift register outputs are circulated. The memory cell array comprises 2 rows×8 columns of memory cells 1a, enabling processing of 2 bits, 6 words. The write port comprises shift registers 21 and 22 and AND gates 25, 27, 28 and 29. The shift register 21 comprises a shift input terminal SI, a trigger input terminal T to which a write clock signal WCLK is applied, a reset input terminal R and output terminals $Q_0$ and $Q_1$. The AND gate 25 has its input gate connected to the write clock signal WCLK and to the output terminal $Q_1$ of the shift register 21, and its output gate connected to the trigger input terminal T of the shift register 22. The shift register 22 comprises a shift input terminal SI, a trigger input terminal T connected to the AND gate 25, a reset input terminal R, output terminals $Q_0$ and $Q_1$, and an output terminal $Q_2$ connected to the shift input terminal SI. The input gates of AND gates 27, 28 and 29 are connected to the output terminals $Q_0$, $Q_1$ and $Q_2$ of the shift register 22, respectively, and the output gates thereof are connected to write column selecting lines CSEL0, CSEL1 and CSEL2.

The read port comprises shift registers 22 and 24 and an AND gate 26. Different from the write port, it receives read clock signals RCLK, and gates corresponding to AND gates 27, 28 and 29 are not provided.

Figure 24:
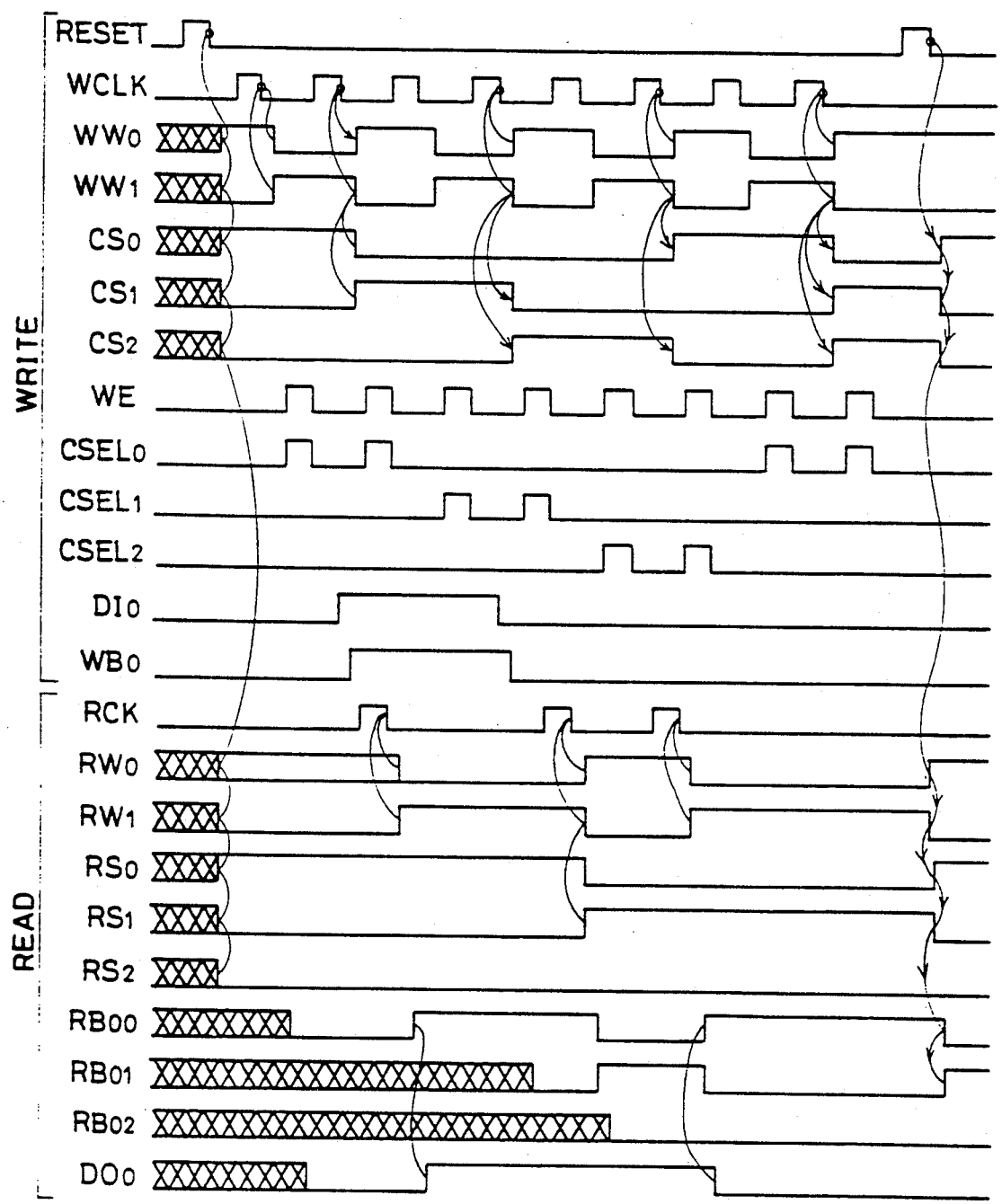
FIG. 24 is a timing chart of FIG. 22.

The operation of the multiport memory of FIG. 22 will be described with reference to FIGS. 22, 23 and 24.

FIG. 23 shows a layout of memory cells 1a in a portion surrounded by a chain dotted line in FIG. 22. FIG. 24 is a timing chart of the multiport memory of FIG. 22.

First, in response to a fall of a reset signal, the shift registers 21 to 24 set the value of the output terminal $Q_0$ to "1" and the values of the output terminals $Q_1$ and $Q_2$ to "0". Consequently, the write word line WW0, write column signal line SCEL0, the read word line RW0 and the read column signal line RS0 are set to "1". Then, in response to the fall of the write clock signal WCLK, the shift register 21 shifts the values of the output terminals $Q_0$ and $Q_1$ to invert levels of WW0 and WW1. The AND gate 25 provides logical product of the write clock signal WCLK and the value of the output terminal $Q_1$ of the shift register 21. The resulting logical product has the period twice that of the output $Q_1$ of the shift register 21 (corresponding to 2 rows of the memory cell array).

The logical output value of the AND gate 25 is applied to the trigger input terminal T of the shift register 22. In response to the logical output value, the shift register 22 shifts the values of the output terminals $Q_0$, $Q_1$ and $Q_2$ and output signals CS0 to CS2 to the AND gates 27 to 29. The AND gates 27 to 29 control the write column selecting lines CSEL0 to CSEL2 in response to the write enable signal WE and to the signals CS0 to CS2. Consequently, the value of the data input terminal is written to the memory cells 1a connected to the write column selecting lines CSEL0 to CSEL2 whose level is "1".

The reading operation will be described.

The shift registers 23 and 24 and the AND gate 26 operates approximately in the same manner as the shift registers 21 and 22 for writing, to control the read word lines RW0 and RW1 and the read column selecting lines RS0 to RS2. However, the operation is different from the writing operation in that the read column selecting lines RS0 to RS2 are not activated by the write enable signal WE.

In such a multiport memory, the memory cell is selected at every fall of the write clock signal WCLK or read clock signal RCLK, and memory cells are successively selected in the order of MC0, MC1, MC2, MC3, MC4, MC5, MC0, MC1 . . . , with the value therein shifted one by one.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device of M words N bits having a plurality of ports, comprising:
 a memory cell array of a plurality of memory cells arranged in (M/n) rows and (n×N) columns, each including a data storage node;
 write word lines and read word lines commonly connected to memory cells of one row included in said memory cell array, respectively;
 n write column selecting lines provided corresponding to the number of words (n) included in one row of said memory cell array connected to every n (the number of words) memory cells of the memory cells of each of said rows;
 write bit lines and read bit lines connected to one column or plural of columns of memory cells included in said memory cell array;

input terminals to which data is input for driving said write bit lines; and output terminals from which data read from said memory cells is output; wherein in response to data applied to any of said input terminals, said write bit lines are driven, and in response to a signal output to any of said write word lines and of said write column selecting lines, electrical connection between the write bit line and the data storage node of the memory cell connected to the write bit line is controlled, so that a first port is formed by the write bit lines, the write word lines and the input terminals;

in order to drive any of said read bit lines to data corresponding to a value of the data storage node of said memory cell, the corresponding one of the read word lines is driven, and data corresponding to a signal on the read bit line is outputted to the corresponding one of said output terminals, so that a second port is formed by the read bit lines, the read word lines and the output terminals.

2. A semiconductor memory device according to claim 1, further comprising:
said write bit lines comprise N write bit lines corresponding to the number of bits (N), each connected to n (the number of words) memory cells of each row.

3. A semiconductor memory device according to claim 1, further comprising:
a write address decoder receiving a write address signal, and responsive to the write address signal, outputting a signal to said write word lines;
a write column address decoder receiving a write column address signal, and responsive to the write column address signal, outputting a signal to said write column selecting lines;
decoder receiving a read address signal, and responsive to the input read address signal, outputting a read word signal to said read word lines;
write means for driving, based on data inputs to said input terminals, write bit lines connected to a set of n (the number of words) memory cells of each row included in said memory cell array; and
sense amplifiers for outputting data read to said read bit lines to said output terminals.

4. A semiconductor memory device according to claim 1, wherein
said write column selecting line comprises two sets of selecting lines respectively connected to one memory cell and the other memory cell of adjacent memory cells of each row.

5. A semiconductor memory device according to claim 1, wherein
said write bit line is commonly connected to one memory cell and the other memory cell of the adjacent memory cells of each row.

6. A semiconductor memory device according to claim 1, wherein
each memory cell constituting said memory cell array comprises memory means for storing data, first and second access gates connected in series between said write bit line and said memory means, a third access gate connected between said memory means and said read bit line, said first access gate being responsive to a signal applied to said write word line for applying the data applied to said write bit line to said second access gate, said second access gate being responsive to a signal applied to said write column selecting line for writing data applied to the write bit line to said memory means, and said third access gate being responsive to a signal applied on said read word line, for reading data stored in said memory means.

7. A semiconductor memory device according to claim 6, wherein
said first access gate comprises two conductive terminals, one connected to the write bit line, the other connected to the second access gate included in said adjacent two memory cells of the same row.

8. A semiconductor memory device according to claim 1, wherein
said write word line is commonly usable as said read word line, said commonly usable write word line being connected to memory cells of the same row of said memory cell array,
said write address decoder is commonly usable as said read address decoder, said commonly usable write address decoder responsive to input write address signal and read address signal, applying a signal to said commonly usable write word line, and said write column address decoder responsive to a write enable signal and a write address signal, applying a signal to said write column selecting line.

9. A semiconductor memory device according to claim 8, wherein
said commonly usable write word line is commonly connected to the first and third access gates of each of the memory cells constituting said memory cell array.

10. A semiconductor memory device according to claim 8, wherein
said write bit line is commonly usable as a read bit line, said commonly usable write bit line being commonly connected to adjacent two memory cells of the memory cells of each row, and
said write means is activated by said write enable signal.

11. A semiconductor memory device according to claim 10, wherein
each of said memory cells comprises memory means, first and second access gates connected in series between said commonly usable write bit line and said memory means, and third and fourth access gates connected in series between said memory means and said commonly usable write bit line, said first access gate being responsive to a signal applied to said commonly usable write word line for applying data applied to said commonly usable write bit line to the second access gate, said second access gate being responsive to a signal applied to said write column selecting lines for writing data applied to said commonly usable bit line to the memory means, said fourth access gate being responsive to a signal applied to said read column selecting line for applying data stored in said memory means to said third access gate, and said third access gate being responsive to a signal applied to said commonly usable write word line for outputting data stored in said memory means to said commonly usable write bit line.

12. A semiconductor memory device according to claim 1, wherein
each of said write address decoder, the read address decoder, the write column address decoder and the read column address decoder comprises shifting means for shifting an output value, said write address decoder activates write word lines successively in response to an input write clock signal, said write column address decoder successively activates write column selecting lines in response to a logical output from said write address decoder and said write clock signal, said read address decoder successively activates read word lines in response to an input read clock signal, and said read column address decoder successively activates read column selecting lines in response to a logical output of said read address decoder and the read clock signal.

13. An N-bit data path including a plurality of 1-bit data paths having similar function and similar lay-out arranged in a first direction, each said 1-bit data path employing a semiconductor memory device of 1-bit M-word having first and second ports, comprising:

an N-bit M-word structured memory device including N said 1-bit M-word memory devices arranged in the first direction; and an N-bit structured arithmetic operation means including N 1-bit structured arithmetic operation means arranged in the first direction, said 1-bit structured arithmetic operation means receiving data output from said second port and sending results of arithmetic operation to said first port; wherein said N-bit m-word structured memory device includes:

a memory cell array including memory cells of M words arranged in M/n rows and n columns, each including a data storage node, the memory cells belonging to the same row extending in the first direction;

write word lines and read word lines each being commonly connected to memory cells of one row included in the memory cell array;

a set of write column selecting lines corresponding to the number n of said columns each connected to one of n memory cells of each row; and write bit lines and read bit lines each connected to memory cells of one column or plural columns in said memory cell array;

said first port including said write word lines, said write column selecting lines and said write bit lines for writing input data to any of said data storage nodes, said second port including said read word lines and said read bit lines for reading data from any of said data storage nodes.

14. A semiconductor memory device according to claim 2, comprising:

a switching element connected between said sense amplifier and the bit line connected to said n (the number of words) memory cells, and a read column address decoder receiving said read address signal and responsive to the read address signal, for switching said switching element.

15. A semiconductor memory device according to claim 2, wherein each of said write address decoder, the read address decoder, the write column address decoder and the read column address decoder comprises shifting means for shifting an output value, said write address decoder activates write word lines successively in response to an input write clock signal, said write column address decoder successively activates write column selecting lines in response to a logical output from said write address decoder and said write clock signal, said read address decoder successively activates read word lines in response to an input read clock signal, and said read column address decoder successively activates read column selecting lines in response to a logical output of said read address decoder and the read clock signal.

16. A semiconductor memory device according to claim 3, wherein each of said write address decoder, the read address decoder, the write column address decoder and the read column address decoder comprises shifting means for shifting an output value, said write address decoder activates write word lines successively in response to an input write clock signal, said write column address decoder successively activates write column selecting lines in response to a logical output from said write address decoder and said write clock signal, said read address decoder successively activates read word lines in response to an input read clock signal, and said read column address decoder successively activates read column selecting lines in response to a logical output of said read address decoder and the read clock signal.

* * * * *